(12) United States Patent
Mori

(10) Patent No.: US 6,501,127 B2  
(45) Date of Patent: *Dec. 31, 2002

(54) SEMICONDUCTOR DEVICE INCLUDING A NONVOLATILE MEMORY-CELL ARRAY, AND METHOD OF MANUFACTURING THE SAME

(75) Inventor: Seiichi Mori, Tokyo (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/271,209

(22) Filed: Mar. 17, 1999

(65) Prior Publication Data

US 2002/0050612 A1 May 2, 2002

(30) Foreign Application Priority Data

Mar. 27, 1998 (JP) .......................................... 10-081068

(51) Int. Cl.[7] ............................................. H01L 29/788
(52) U.S. Cl. ........................ 257/321; 257/315; 257/316; 257/758
(58) Field of Search ................................. 257/321, 296, 257/314, 315, 316, 758; 438/253, 254, 255, 256, 257, 258, 259, 260, 261, 262, 263, 264, 618, 622; 365/185.05

(56) References Cited

U.S. PATENT DOCUMENTS 5,262,985 A * 11/1993 Wada .......................... 365/185  
5,705,415 A * 1/1998 Orlowski et al. ............. 437/43  
5,814,850 A * 9/1998 Iwasa .......................... 257/296  
5,986,299 A * 11/1999 Nakamura et al. .......... 257/296  
6,187,632 B1   2/2001 Shuto et al.

FOREIGN PATENT DOCUMENTS

JP 60-145641 8/1985  
JP 09-129844 5/1997

* cited by examiner

Primary Examiner—Olik Chaudhuri  
Assistant Examiner—Theresa T. Doan  
(74) Attorney, Agent, or Firm—Banner & Witcoff, Ltd.

(57) ABSTRACT

A memory-cell array and peripheral circuit elements are formed together on a semiconductor substrate. A first interlayer insulating film is formed, covering the memory-cell array region and peripheral circuit region of the substrate. A first layer of wires is formed on the first interlayer insulating film. A second interlayer insulating film is formed on the first interlayer insulating film, covering the wires of the first layer. A second layer of wires is formed on the second interlayer insulating film. A third interlayer insulating film is formed on the second interlayer insulating film, covering the wires of the second layer. The third interlayer insulating film is processed to have a flat upper surface. A third layer of wires is formed on only that part of the third interlayer insulating film, which lies above the peripheral circuit region. Thereafter, a passivation film is deposited on the third interlayer insulating film. That part of the passivation film, which lies above the memory cell region, has a flat body.

18 Claims, 6 Drawing Sheets

SEMICONDUCTOR DEVICE INCLUDING A NONVOLATILE MEMORY-CELL ARRAY, AND METHOD OF MANUFACTURING THE SAME

BACKGROUND OF THE INVENTION

The present invention relates to a one-chip semiconductor device in which circuit elements of a peripheral circuit such as a logic circuit are integrated on one chip together with a nonvolatile memory-cell array, and also relates to a method of manufacturing the semiconductor device.

In most one-chip semiconductor devices having a nonvolatile memory-cell array, the similar wiring structure is used in the memory-cell array region and the other region for circuits other than the memory-cell array (hereinafter referred to as "peripheral circuits") such as cell array driver circuits formed around the memory-cell array, logic circuits and SRAMs both formed around the cell-array driver circuits.

In the nonvolatile memories developed hitherto, one metal wiring layer or two metal wiring layers are provided in the memory-cell array region. The wires of the uppermost layer provided on the memory-cell array region have been finely patterned in accordance with design rules. These wires cause stepped portions of a passivation film formed on the wires. Thus, so called step coverage of the passivation film, i.e., protection film formed on the wires of the uppermost layer, is inevitably diminished.

FIG. 11 is a sectional view of a conventional nonvolatile memory device in which a two-layer wiring structure is used in both the memory-cell array region MR and the peripheral circuit region PR. A memory-cell array having nonvolatile memory cells MC is formed in the memory-cell array region MR of the silicon substrate 1. Each of the memory cells MC has a floating gate FG and a control gate CG. Peripheral circuits are formed in the peripheral circuit region PR. Each peripheral circuit comprises MOS transistors Q of ordinary type, each having a source S, a drain D and a gate G.

As shown in FIG. 11, a first interlayer insulating film 2 is formed on the silicon substrate 1 and covers the memory cells MC and the MOS transistors Q. First-layer wires 3 are formed on the upper surface of the first interlayer insulating film 2. A second interlayer insulating film 4 is provided on the first interlayer insulating film 2 and covers the first-layer wires 3. Second-layer wires 5 are formed on the second interlayer insulating film 4. A passivation film 6 acting as a protection film is formed on the second interlayer insulating film 4 and covers the second-layer wires 5.

Contact metal such as tungsten are filled in via holes formed in the first interlayer insulating film 2 so that n$^+$ regions formed in the surface of the silicon substrate 1 and the first-layer wires 3 are connected with each other by contacts 17. Further, via holes are formed to provide contacts 17 between the first-layer wires 3 and the second-layer wires 5 as shown in FIG. 11.

As in most nonvolatile memories, the passivation film 6 is a silicon nitride film (hereinafter referred to as "plasma nitride film") formed by means of plasma CVD method. The plasma nitride film 6 hardly allows passage of moisture, hydrogen or impurities such as positive mobile ions. However, this nitride film 6 is inferior to TEOS (Tetraethyloxysilane) film and SOG (Spin-On-Glass) film in terms of the step coverage. If the second-layer wires 5 are arranged at a short pitch of, for example, 0.4 micron line and space, the passivation film 6 will have thin portions 7 and voids 8 at the step portions between second-layer wires 5 as is illustrated in FIG. 11. Each thin portion 7 formed at a step defined by a side of a wire 5 and the upper surface of the second interlayer insulating film 4 will fail to function as a passivation film perfectly. Mobile impurity ions such as sodium and humidity may pass through the thin portions 7 and first and second interlayer insulating films 2 and 4 from outside into the memory-cell array. This would lower the reliability of the memory-cell array, for example, endurance characteristics and data retention characteristics. The voids 8 are likely to hold contaminant including humidity and impurities during the manufacture of the nonvolatile memory device. If held in the voids 8, the impurities and humidity included in the contaminant will adversely influence the memory-cell array.

Mobile impurity ions, hydrogen and humidity may enter the memory-cell array, in such a small amount that they would make no problems in ordinary MOS transistor circuits. Even if they exist in so small an amount, they will likely destroy data in the memory-cell array after the nonvolatile memory device has delivered to the user.

The memory device shown in FIG. 11 may be a NOR-type flash memory device. If so, the first-layer wires 3 are used as bit lines in the memory-cell array region MR, while the second-layer wires 5 are used as wires backing word lines or bit lines or used as subsidiary wires for split signal lines of a word-line decoder or for the split bit lines.

If the second-layer wire 5 is used as word-line backing wire, each wire 5 may be used for one word line or a plurality of word lines. In the case where each wire 5 backs one word line, the wires 5 must be arranged at a short pitch. If so, the passivation film 6 will have many defects due to the degraded step coverage. Even if the pitch is relatively long, the step coverage of the passivation film 6 is insufficient at either side (i.e., step portion) of each wire 5. Consequently, mobile impurity ions and humidity will pass through the defects formed in the passivation film 6, eventually entering the memory-cell array.

As mentioned above, the similar wiring structure is used in the uppermost metal wiring layer of memory-cell array region MR and peripheral circuit region PR of the conventional nonvolatile memory device shown in FIG. 11. Therefore, the passivation film 6, i.e., the uppermost layer of the memory device, has defects, inevitably lowering the reliability of the memory-cell array. A decrease in the reliability of the cell array must be prevented. To this end, an insulating film may be formed on the second interlayer insulating film 4, covering the second-layer wires 5 and having a flat upper surface, and the passivation film 6 may be formed on the upper surface of the insulating film. This results, however, in an increase in the number of manufacturing steps and, hence, an increase in cost.

In the conventional nonvolatile memory device, metal wires are provided above the memory-cell array. The metal wires block the ultraviolet rays applied to neutralize the memory cells. The greater the number of layers of wires provided, and the shorter the pitch at which the wires of each layer are arranged, the longer the time required to neutralize the memory-cell array.

Further, the greater the number of wires provided above the memory-cell array, the greater the charging damage affected to the nonvolatile memory cells in the process of manufacturing the nonvolatile memory device. The charging damage results from discharge of high-voltage static electricity that is generated during the wire forming process. Hence, the greater the number of layers of wires provided above the memory-cell array, the larger the charging damage.

BRIEF SUMMARY OF THE INVENTION

The present invention has been made in view of the above and has its object to provide a semiconductor device capable of being made at minimum cost and in which the wiring structure is improved to enhance the reliability of the memory-cell array. Another object of the invention is to provide a method of manufacturing the semiconductor memory device.

According to the first aspect of the present invention, there is provided a semiconductor memory device which comprises:

a semiconductor substrate having a first region and a second region located adjacent to the first region;

a memory-cell array including a plurality of nonvolatile memory cells provided in the first region of the semiconductor substrate;

a peripheral circuit formed of circuit elements other than the nonvolatile memory cells and provided in the second region of the semiconductor substrate; and a multi-layered wiring structure including a plurality of interlayer insulating films, one located above another, for covering the memory-cell array and the circuit elements, and a plurality of layers of wires provided in the interlayer insulating films, wherein the layers of wires include an m number of layers of wires located in regions of the interlayer insulating films corresponding to the first region of the semiconductor substrate, and an n number of layers of wires located in regions of the interlayer insulating films corresponding to the second region of the semiconductor substrate, where n>m.

According to the second aspect of the invention, there is provided a semiconductor memory device which comprises:

a semiconductor substrate having a first region and a second region located adjacent to the first region;

a memory-cell array including a plurality of nonvolatile memory cells provided in the first region of the semiconductor substrate;

a peripheral circuit including circuit elements other than the nonvolatile memory cells and provided in the second region of the semiconductor substrate;

a multi-layered wiring structure including a plurality of interlayer insulating films, one located above another, for covering the memory-cell array and the circuit elements, and a plurality of layers of wires provided in the interlayer insulating films, wherein the layers of wires include an m number of layers of wires located in regions of the interlayer insulating films corresponding to the first region of the semiconductor substrate, and an n number of layers of wires located in regions of the interlayer insulating films corresponding to the second region of the semiconductor substrate, where n>m; and a passivation film provided on an uppermost film of the interlayer insulating films, which has a part having a substantially flat body laying above the first region of the semiconductor substrate in which the m layers of the wires are located.

In the semiconductor memory device according to the second aspect of the present invention, the signal lines may be metal wires, and the passivation film may include a plurality of layers, at least the uppermost of the layers being a silicon nitride film formed by means of a plasma CVD method. Further, in a preferred embodiment of the present invention, a surface of the uppermost interlayer insulation film laying beneath the passivation film is provided with a $SiH_4$ plasma CVD film having a flat surface with no contact hole.

The memory device according to the second aspect may further comprise a plate electrode located beneath a part of the passivation film which lies in the first region. The plate electrode is made of the same material as the signal lines of at least one layer provided in the second region and located above the m-th layer of signal lines, and covering the memory-cell array. In this case, the plate electrode may be connected to at least one terminal provided in the first region of the semiconductor substrate.

In the memory device according to the second aspect, the memory-cell array has a memory-cell array body storing data and a reference memory-cell array for imparting a threshold value to the memory cells included in the memory-cell array body. Further, the plate electrode is located above only a part of the memory-cell array in which the memory-cell array body is provided.

According to the third aspect of this invention, there is provided a method of manufacturing a semiconductor memory device which comprises:

forming a memory-cell array and circuit elements other than the memory cells on a semiconductor substrate, the memory-cell array comprising a plurality of nonvolatile memory cells;

forming a plurality of interlayer insulating films, one located above another, each covering the memory-cell array and the circuit elements;

forming an m number of layers of signal lines, on the respective interlayer insulating films covering the memory-cell array;

forming an n number of layers of signal lines, on the respective interlayer insulating films covering the circuit elements other than the memory-cell array, where n>m; and forming a passivation film on the uppermost of the interlayer insulating films, which has a substantially flat upper surface lying above the memory-cell array.

In the method, an interlayer insulating film having the substantially flat upper surface may be deposited on an m-th signal-line layer covering the memory-cell array and the circuit elements. Then, after at least one signal-line layer is deposited above the m-th signal-line layer, a part of the at least one signal-line layer which lies above the circuit elements is patterned to form an n-th layer signal lines, leaving the remaining part as a plate electrode which covers the memory-cell array.

The method may further comprise applying ultraviolet rays to the memory-cell array, thereby neutralizing the memory-cell array, before the at least one signal-line layer is deposited.

In the present invention, fewer layers of signal lines are provided in the memory-cell array region than in the peripheral circuit region. The interlayer insulating film, on which the signal lines of the uppermost layer are provided in the peripheral circuit region, is processed to have a flat upper surface. This interlayer insulating film covers the signal lines of the uppermost layer provided in the memory-cell array region. Hence, that part of the passivation film, which lies above the memory-cell array region, is deposited on a flat surface. As a result, this part of the passivation film is sufficiently thick and has no defects such as voids or the like, even if the passivation film is one having insufficient step coverage, such as a plasma nitride film. The passivation film can prevents the memory-cell array from deteriorating in terms of reliability. Since no signal wires of the uppermost layer are provided above the memory-cell array region, the memory cells can be initialized within a shorter time than otherwise, by application of ultraviolet rays.

Having more layers of signal lines than the memory-cell array, the peripheral circuit can have high integration density and can operate at high speed.

In the process of forming the signal lines of the uppermost layer, that part of a metal film, which lies above the memory-cell array region, is not patterned into signal wires. This part of the metal film is used as a plate electrode, which covers the memory-cell array and effectively prevents contaminant such as impurities and humidity from entering the memory-cell array. The plate electrode needs not be made of the same material as the signal lines of the uppermost layer, which are provided in the peripheral circuit region. It only needs to be located above the uppermost layer of signal lines provided in the region of the memory-cell array.

Once the plate electrode has been formed above the memory-cell array region, it is no longer easy to neutralize or initialize the memory-cell array by applying ultraviolet rays to the array. Nonetheless, if the memory cells are electrically erasable programmable ones, it suffices to apply ultraviolet rays to the reference memory-cell array which generates a threshold value for data programming. Hence, the plate electrode may be provided over the body region of the memory-cell array only, not above the reference memory-cell array.

As mentioned above, it no longer easy to apply ultraviolet rays to the memory-cell array once the plate electrode has been formed. To neutralize (or initialize) the memory-cell array, it is desired that ultraviolet rays be applied immediately before the film to be processed into the plate electrode and the signal lines, is deposited on the uppermost interlayer insulating film.

The plate electrode may be electrically connected to the substrate in which the memory cells are formed or to a terminal made of a diffusion layer provided in a well. The plate electrode therefore protects the memory cells from charging damage which will occurs when wires are formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail, with reference to the accompanying drawings.

Figure 1:
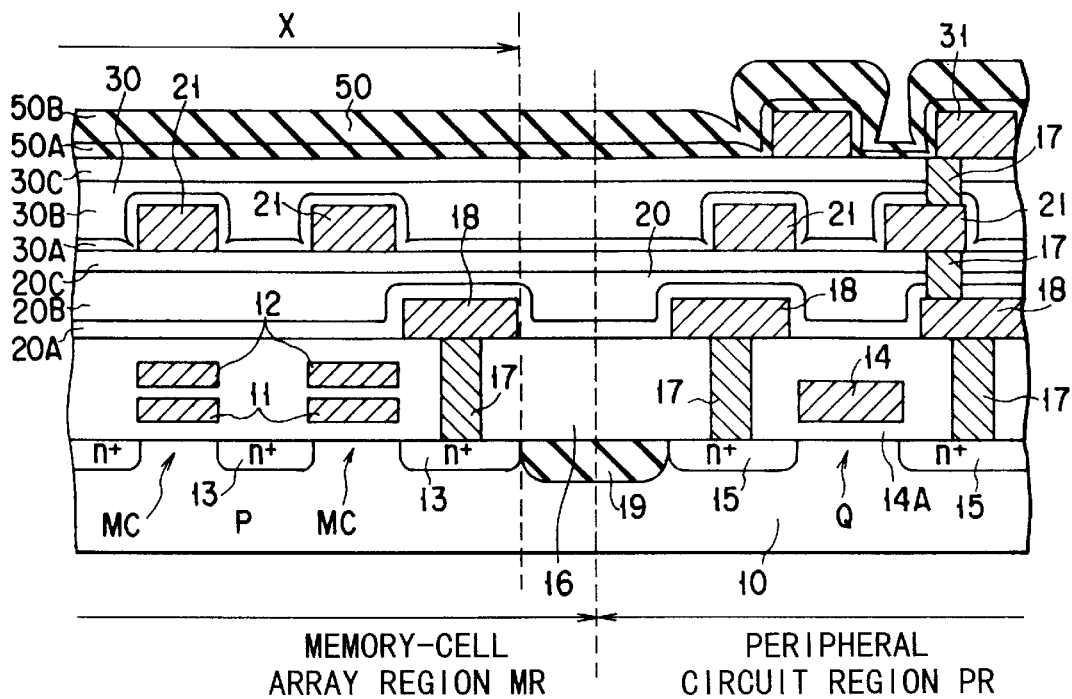
FIG. 1 is a sectional view of a semiconductor memory device having nonvolatile memory cells, which is a first embodiment of the present invention.

FIG. 1 is a sectional view of a main part of a semiconductor memory device according to the first embodiment of the invention. More precisely, FIG. 1 shows a sectional view of the memory-cell array region MR and peripheral circuit region PR of the semiconductor memory device. Memory cells MC of stack-gate structure are arranged in the memory-cell array region MR. Peripheral circuits, each including MOS transistors Q, are provided in the peripheral circuit region PR. In the memory-cell array region MR, metal wires are provided in two layers. In the peripheral circuit region PR, metal wires are provided in three layers.

A method of manufacturing the memory device having the structure shown in FIG. 1 will be explained.

Memory cells MC are formed in the memory-cell array region MR of a p-type silicon substrate 10. Each memory cell MC has a floating gate 11, a control gate 12 and two $n^+$-type diffusion layers 13. The control gate 12 is located above the floating gate 11, with a gate insulating film interposed between the gates 11 and 12. The diffusion layers 13 serve as a source and a drain, respectively. NMOS transistors Q and other circuit elements are formed in the peripheral circuit region PR of the silicon substrate 10.

Each NMOS transistor Q has a gate electrode 14 and two diffusion layers 15 of $n^+$-type. The gate electrode 14 is formed on a gate insulating film 14A, which is provided on the substrate 10. The diffusion layers 15 serve as a source and a drain, respectively. PMOS transistors (not shown) are formed also in the peripheral circuit region PR if the peripheral circuit is a CMOS type.

Then, a first interlayer insulating film 16 is deposited on the substrate 10, covering the floating gate 11, control gate 12 and gate electrode 14. An interlayer insulating film structure having a flat upper surface is thereby provided. Via holes are formed in the first interlayer insulating film 16 to form contacts 17 made of W (tungsten) or the like in the first interlayer insulating film 16. The contacts 17 reach the diffusion layers 13 and 15. The first interlayer insulating film 16 is, for example, a BPSG film. The surface of the interlayer insulating film 16 is made flat by means of a CMP method, for example to expose tips of the contacts 17 at the surface of the film 16.

A metal film, such as an Al (aluminum) film, is formed on the first interlayer insulating film 16. The metal film is patterned to form first-layer wires 18 some of which is connected to the contacts 17. Some of the wires 18 are provided in the memory-cell array region MR, and the other wires 18 are provided in the peripheral circuit region PR.

Next, a second interlayer insulating film 20 is deposited on the first interlayer insulating film 16, covering the first-layer wires 18. If the memory is a nonvolatile one, it is desired that the second interlayer insulating film 20 be a multi-layered structure such as three-layer film, which is formed as will be described below.

First, a first film 20A is formed on the first interlayer insulating film 16, covering the first-layer wires 18. The first film 20A may be a thin silicon nitride film formed by plasma CVD using $SiH_4$ as feed material and having a thickness of, for example, 50 nm to 200 nm.

Then, a second film 20B is formed on the first film 20A. The second film 20B is one that has easy burying property. Preferably, the film 20B has a small dielectric constant to reduce the capacitance between the wires. The film 20B may be an oxide film formed by plasma CVD using organic silane such as TEOS as feed gas. Alternatively, it may be an oxide film formed by high-density plasma (HDP) CVD, an oxide film formed by plasma process using fluorine to reduce dielectric constant, or a SOG (Spin-On-Glass) film formed by coating.

These films, which may be used as the second film 20B, contain water or contaminant including impurities in large quantities in most cases. They may adversely influence the reliability of the nonvolatile memory cells MC. For example, they may decrease the charge-retaining property of the memory cells MC. This why the first film 20A is provided, covering the first-layer wires 18. Made by plasma CVD using $SiH_4$ as feed gas, the first film 20A prevents the humidity, hydrogen or impurities, which are contained in the second film 20B, from entering the memory cells MC and the like that are provided below the second film 20B.

Thereafter, the second film 20B is polished at its upper surface by means of, for example, CMP (Chemical Mechanical Polishing). As a result, the second film 20B has a flat upper surface. Further, a third film 20C is formed preferably on the second film 20B, by means of plasma CVD using $SiH_4$ as feed gas. The third film 20C may be, for example, 200 nm to 500 nm thick, serving as the top layer of the second interlayer insulating film 20. The third film 20C prevents humidity, hydrogen or impurities from diffusing from any upper layer into any lower layer, to enhance the reliability of the nonvolatile memory cells. Via holes are formed through the second interlayer insulating film 20 to form contacts 17 lower end of which is connected to the first-layer wires 18 and upper end of which exposes at the surface of the third film 20C followed by the CMP polishing of the film 20C.

Further, second-layer wires 21 are formed on the second interlayer insulating film 20, in the same way as the first-layer wires 18. That is, a metal film such as an Al film is formed on the film 20 and patterned to form second-layer wires 21. Some of the wires 21 are provided in the memory-cell array region MR, and the others of the wires 21 are provided in the peripheral circuit region PR. Then, a third interlayer insulating film 30 is deposited on the second interlayer insulating film 20, covering the second-layer wires 21. The insulating film 30 is made of the same materials and by the same method as the second interlayer insulating film 20. The insulating film 30 is made flat at its upper surface.

As will be described in detail later, the uppermost part of the third insulating film 30 is preferably made of a plasma CVD oxide film using $SiH_4$ as a feed material. In this embodiment, the third interlayer insulating film 30 is formed as a three-layered structure having a thin plasma oxide film 30A using $SiH_4$ gas, a flattened intermediate film 30B and the plasma CVD oxide film 30C of 200 nm to 500 nm thick.

First, a first film 30A is formed on the second interlayer insulating film 20, covering the second-layer wires 21. The first film 30A may be a thin silicon nitride film formed by plasma CVD using $SiH_4$ as feed material and having a thickness of, for example, 50 nm to 200 nm.

Then, a second film 30B is formed on the first film 30A. The second film 30B is one that has easy burying property. Preferably, the film 30B has a small dielectric constant to reduce the capacitance between the wires. The film 30B may be an oxide film formed by plasma CVD using organic silane such as TEOS as feed gas. Alternatively, it may be an oxide film formed by high-density plasma (HDP) CVD, an oxide film formed by plasma process using fluorine, or a SOG (Spin-On-Glass) film formed by coating.

These films, which may be used as the second film 30B, contain water or contaminant including impurities in large quantities in most cases. They may adversely influence the reliability of the nonvolatile memory cells MC. For example, they may decrease the charge-retention property of the memory cells MC. This why the first film 30A is provided, covering the first-layer wires 18. Made by plasma CVD using $SiH_4$ as feed gas, the first film 30A prevents the humidity, hydrogen or impurities, which are contained in the second film 30B, from entering the memory cells MC and the like that are provided below the second film 30B.

Thereafter, the second film 30B is polished at its upper surface by means of, for example, CMP (Chemical Mechanical Polishing). As a result, the second film 30B has a flat upper surface. Further, a third film 30C is formed preferably on the second film 30B, by means of plasma CVD using $SiH_4$ as feed gas. The third film 30C may be, for example, 200 nm to 500 nm thick, serving as the top layer of the third interlayer insulating film 30. The third film 30C prevents humidity, hydrogen or impurities from diffusing from any upper layer into any lower layer, to enhance the reliability of the nonvolatile memory cells. Via holes are formed through the third interlayer insulating film 30 to form contacts 17 lower end of which is connected to the second-layer wires 21 and upper end of which exposes at the surface of the third film 30C followed by the CMP polishing of the film 30C.

A metal film, such as an Al film, is formed on only that part of the third interlayer insulating film 30 which lies over the peripheral circuit region PR. Then, the metal film is patterned to form third-layer wires 31 in the peripheral circuit region PR only.

Finally, a passivation film 50 is formed on the third-layer wires 31 and the third interlayer insulating film 30. Preferably, the passivation film 50 consists of two films 50A and 50B. The first film 50A is a TEOS oxide film formed on the third interlayer insulating film 30 and has a thickness of, for example, 300 nm. The second film 50B is a plasma nitride film formed on the first film 50A and has a thickness of, for example, 600 nm. The via holes for forming the contacts 17 are not formed in the portion of the third interlayer insulating film 30 covering the memory cell array region MR but formed in the portion corresponding to the peripheral circuit region PR.

The second film 50B of the passivation film 50 does not allow passage of humidity. However, It contains much hydrogen. Hydrogen may diffuse from the second film 50B through the lower interlayer insulating films into the memory cells MC. Hydrogen, if any in the memory cells MC, will accelerate the deterioration of the characteristic of the tunnel oxide film, which takes place as data is rewritten in the memory cells MC.

Nonetheless, in the memory shown in FIG. 1, no hydrogen diffuses into the memory cells MC. The upper film 30C of the third interlayer insulating film 30, i.e., a plasma oxide film made by using $SiH_4$ as feed gas is flat and uniform. Further, the upper film 30C has no via holes for achieving connection 17 between the second-layer wires 21 and the third-layer wires 31 in the region of the memory-cell array MR. The upper film 30C of the insulating film 30 can trap hydrogen and therefore reliably blocks hydrogen diffusing from the second film 50B of the passivation film 50. Thus, a nonvolatile semiconductor memory of high reliability can be manufactured.

Moreover, no third-layer wires 31 are provided in the memory-cell array region MR in the memory shown in FIG. 1. That part of the passivation film 50, which lies in the memory-cell array region MR, has a flat structure. The flat part of the passivation film 50 achieves good step coverage, at least in the memory-cell array region MR. Hence, the memory-cell array has no defects and maintains its high reliability.

As shown in FIG. 1, the flat part of the passivation film 50 extends over the centerline (indicated by the broken line) of the element isolation region 19. The flat part therefore overlaps a part of the peripheral circuit region PR, as well as the memory-cell region MR in which the memory cells MC are formed in the substantial part X of the memory-cell array region MR. The substantial part X can be defined by the boundary between the outermost $n^+$-region 13 and the element isolation region 19.

Figure 9:
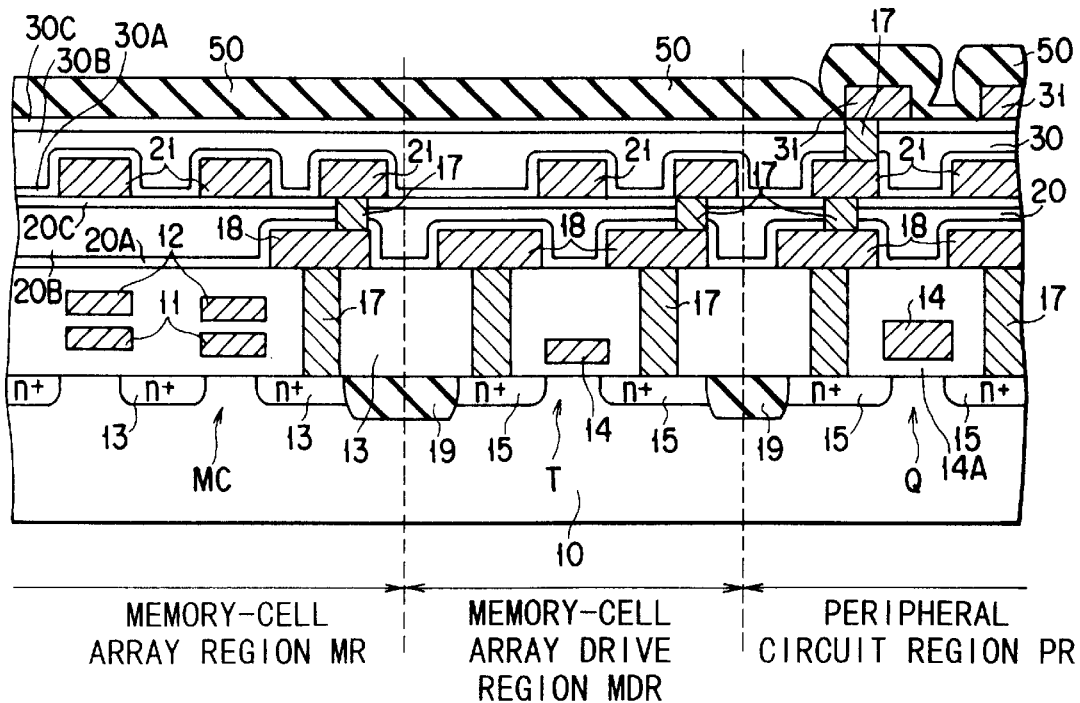
FIG. 9 is a sectional view of a semiconductor memory device having nonvolatile memory-cell array, which is a ninth embodiment of the present invention.

Thus, the passivation film 50 protects the memory-cell array region MR more effectively than otherwise. Alternatively, the flat pat of the passivation film 50 may be positioned as is illustrated in FIG. 9. That is, the flat part may overlap not only the memory-cell array region MR but also a memory-cell array drive circuit region MDR which adjoins the memory-cell array region MR and in which transistors T are formed.

In the first embodiment of FIG. 1, fewer layers of wires (m) are provided in the memory-cell array region MR than those (n) in the peripheral circuit region PR (n>m). The memory cells MC can therefore be initialized by application of ultraviolet rays, within a shorter time than in the case where the same number of wire layers or more wire layers are provided in the region MR than in the peripheral circuit region PR.

To decrease the number of wire layers in the memory-cell array region MR, various measures can be taken. For instance, only wires required for performing the operations of the memory cells MC may be provided in the memory-cell array region MR, while any other wires are arranged in the peripheral circuit region PR.

Wires 31 should be formed on the third interlayer insulating film 30 only in the peripheral circuit region PR. To this end, the upper whole surface of the third interlayer insulating film 30 is polished by means of CMP method. Therefore, that part of the passivation film 50 which lies over the region MR may have a flat upper surface as is desired. The wires 31 are not needed to be covered with a fourth interlayer insulating film but covered with the passivation film 50. This is because no wires are formed on that part of the third interlayer insulating film 30 which lies in the memory-cell array region MR and that part or the passivation film 50 which lies over the region MR therefore has a flat upper surface.

Figure 2:
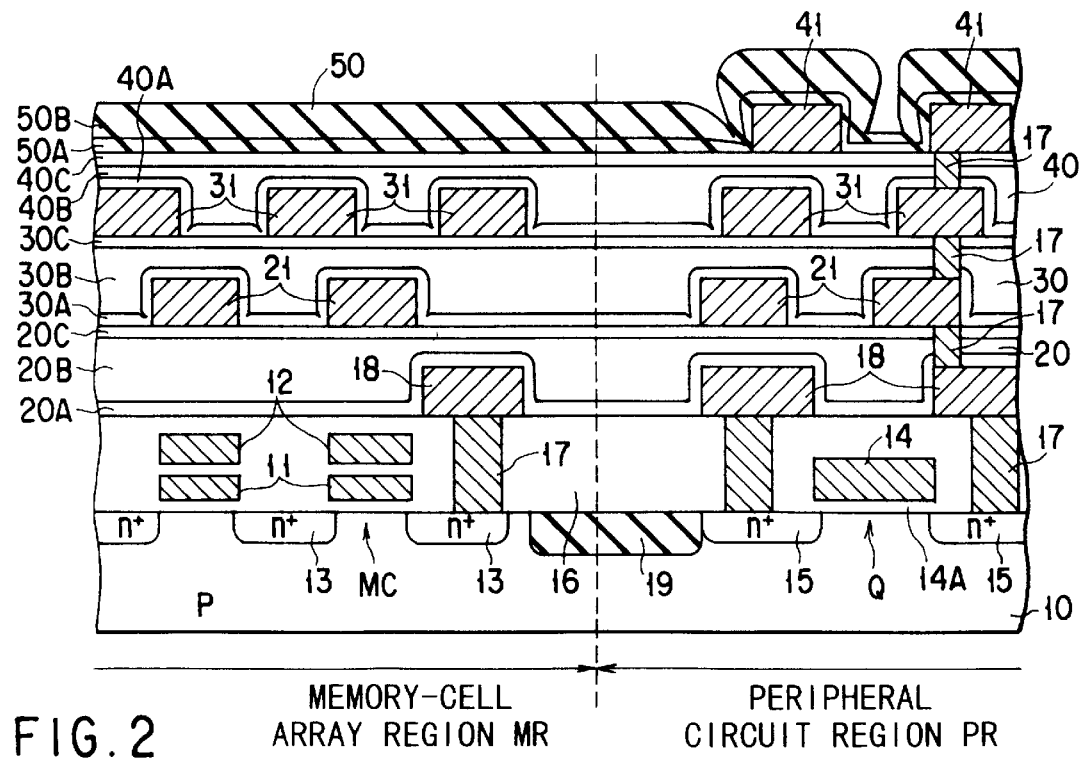
FIG. 2 is a sectional view of a semiconductor memory device having nonvolatile memory-cell array, which is a second embodiment of the invention.

FIG. 2 shows the second embodiment of the present invention, in which three layers of wires are provided in the memory-cell array region MR and fourth layers of wires are provided only in the peripheral circuit region PR. The components identical or similar to those shown in FIG. 1 are designated at the same reference numerals in FIG. 2 and will not described in detail in the following description.

The interlayer insulating films 16, 20 and 30, contacts 17, first-layer wires 18 and second-layer wires 21 are formed in both the memory-cell array region MR and the peripheral circuit region PR, in the same way as in the manufacture of the first embodiment. Thereafter, third-layer wires 31 are formed on the third interlayer insulating film 30 in the same way as in the first embodiment, in both the memory-cell array region MR and the peripheral circuit region PR.

A fourth interlayer insulating film 40 is then formed on the third interlayer insulating film 30, covering the third-layer wires 31. The film 40 is of a three-layer structure and is made of the same material as the second and third interlayer insulating films 20 and 30. Then, the film 40 is processed by CMP to have a flat upper surface.

Finally, a passivation film 50 is formed on the fourth interlayer insulating film 40. That part of the passivation film 50, lying in the memory-cell region MR, has a flat body and that part of the fourth interlayer insulating film 40 including a plasma oxide film 40C and formed in the memory-cell array region MR has no via holes. Therefore, the second embodiment attains the same advantages as the first embodiment.

Figure 3:
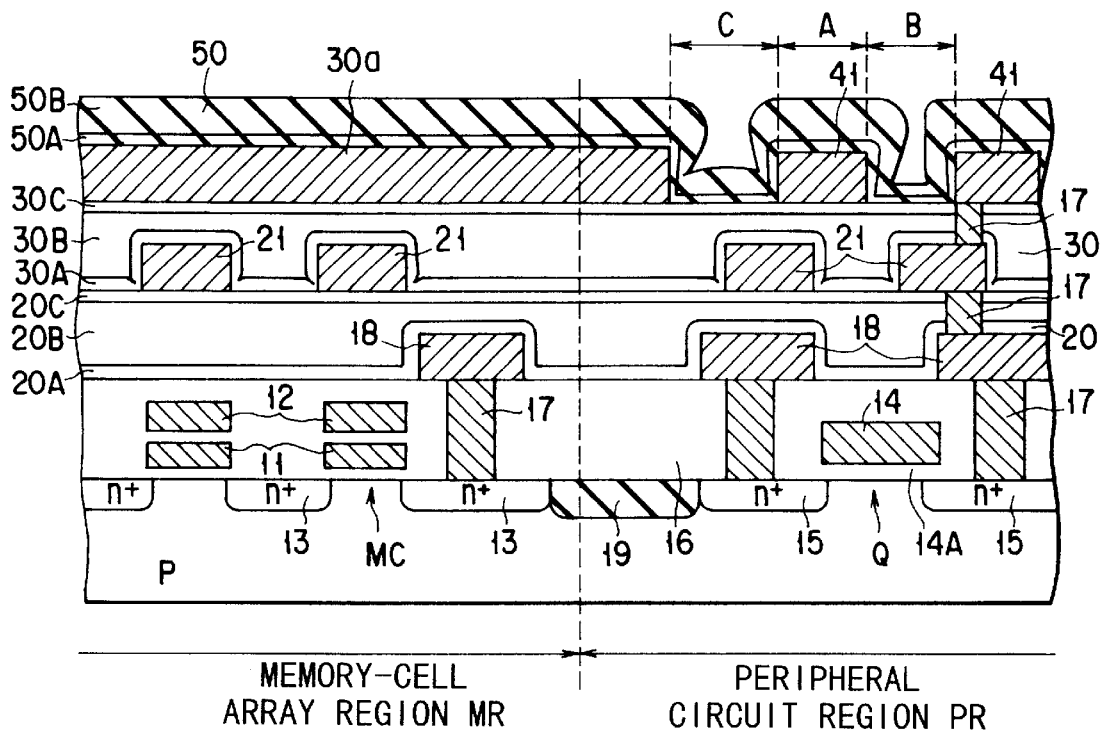
FIG. 3 is a sectional view of a semiconductor memory device having nonvolatile memory-cell array, which is a third first embodiment of this invention.

FIG. 3 shows the third embodiment of the invention, which is identical in structure to the first embodiment except in the following respect.

As shown in FIG. 3, a metal film is formed on the third interlayer insulating film 30, not only in the peripheral circuit region PR but also in the memory-cell array region MR. Only that part of the metal film which lies in the peripheral circuit region PR is patterned to form third-layer wires 41 in the peripheral circuit region PR only. The other part of the metal layer is left as a plate electrode 30a in the memory-cell array region MR.

The third-layer wires 41 have a width A and are arranged at a gap B. The width A and the gap B are, for example, about 0.3 microns. The gap C between the plate electrode 30a and the nearest third-layer wire 41 may be therefore about 0.3 microns. One end of the plate electrode 30a extends into the peripheral circuit region PR, covering not only the memory-cell array region MR but also the adjoining part of the peripheral circuit region PR. Hence, the stepped parts of the passivation film 50 due to the gap C do not reduce the reliability of the memory-cell array.

Figure 4:
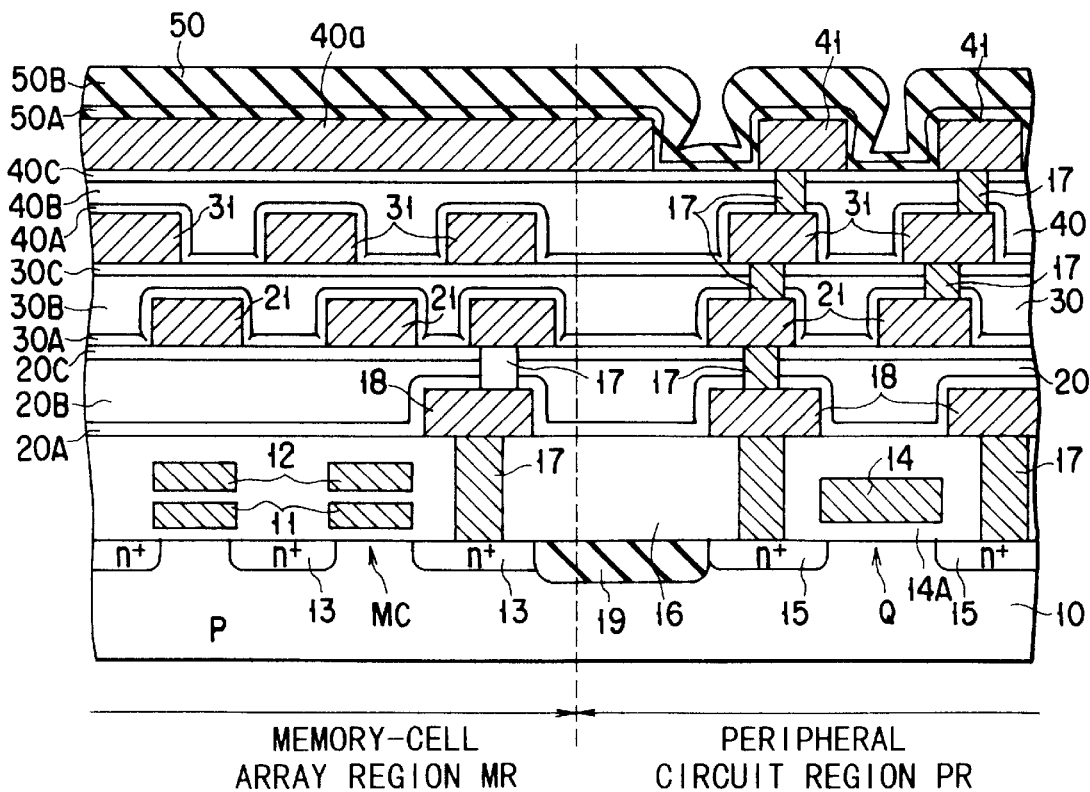
FIG. 4 is a sectional view of a semiconductor memory device having nonvolatile memory-cell array, which is a fourth embodiment of the present invention.

FIG. 4 shows the fourth embodiment of the invention, which is identical in structure to the second embodiment shown in FIG. 2 except in the following respect.

As shown in FIG. 4, a metal film is formed on the fourth interlayer insulating film 40, not only in the peripheral circuit region PR but also in the memory-cell array region MR. Only that part of the metal film which lies in the peripheral circuit region PR is patterned to form third-layer wires 41 in the peripheral circuit region PR only. The other part of the metal layer is left as a plate electrode 40a in the memory-cell array region MR.

In the third embodiment (FIG. 3) and the fourth embodiment (FIG. 4), that part of the passivation film 50, which lies in the memory-cell array region MR, has a flat body. Further, the plate electrodes 30a and 40a cover the entire memory-cell array region MR, preventing contaminant or humidity from entering the memory-cell array. This is because the plate electrodes 30a and 40a, which are made of metal, block humidity, contaminant, and the like more effectively than the interlayer insulating films 16, 20, 30 and 40, in addition to the plasma oxide film 30C or 40C using $SiH_4$ as feed gas for blocking hydrogen.

Figure 5:
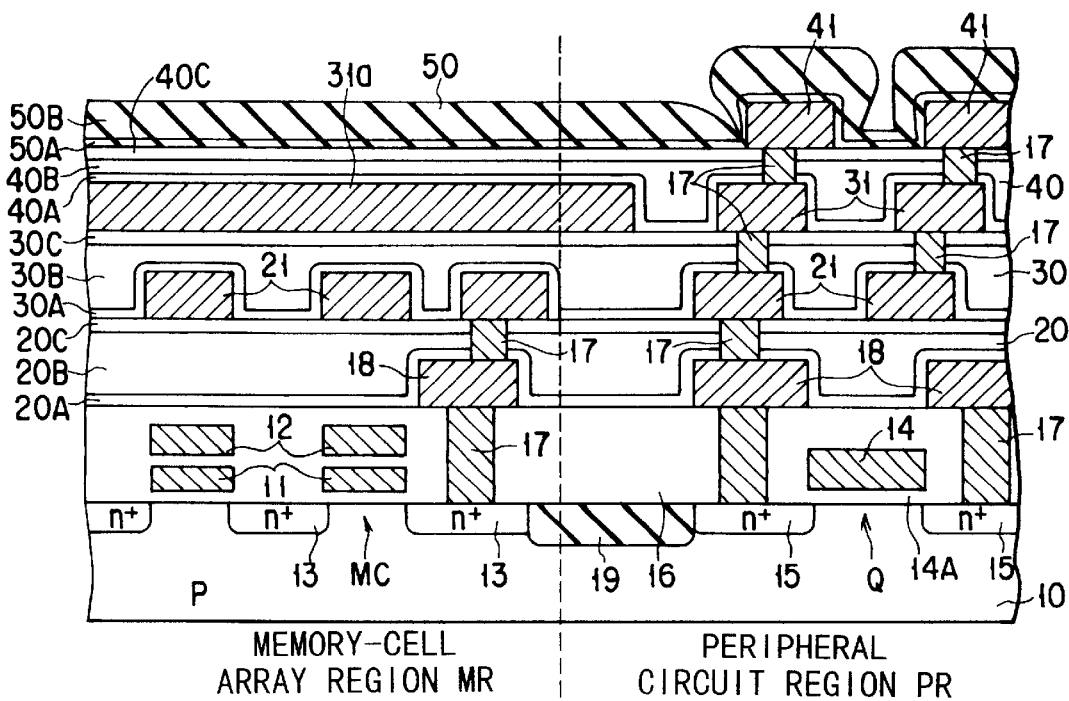
FIG. 5 is a sectional view of a semiconductor memory device having nonvolatile memory-cell array, which is a fifth embodiment of the invention.

FIG. 5 shows the fifth embodiment of the present invention. As shown in FIG. 5, two layers of wires 18 and 21 are provided in the memory-cell array region MR and three layers of wires 18, 21 and 31 are provided in the peripheral circuit region PR, as in the second embodiment (FIG. 2). In the fifth embodiment, when the metal film is patterned to form the third-layer wires 31 in the peripheral circuit region PR, that part of the metal film which lies in the memory-cell array region MR, is not patterned and left as an plate electrode 31a.

Then, the fourth interlayer insulating film 40 including first, second and third films 40A, 40B and 40C is formed as in the foregoing embodiments, followed by the process for forming contacts 17 via the film 40. Finally, after the CMP method is performed on the upper surface of the film 40, a passivation film 50 having the similar structure is formed on the fourth interlayer insulating film 40 to form a flat body in the memory-cell array region MR.

Figure 6:
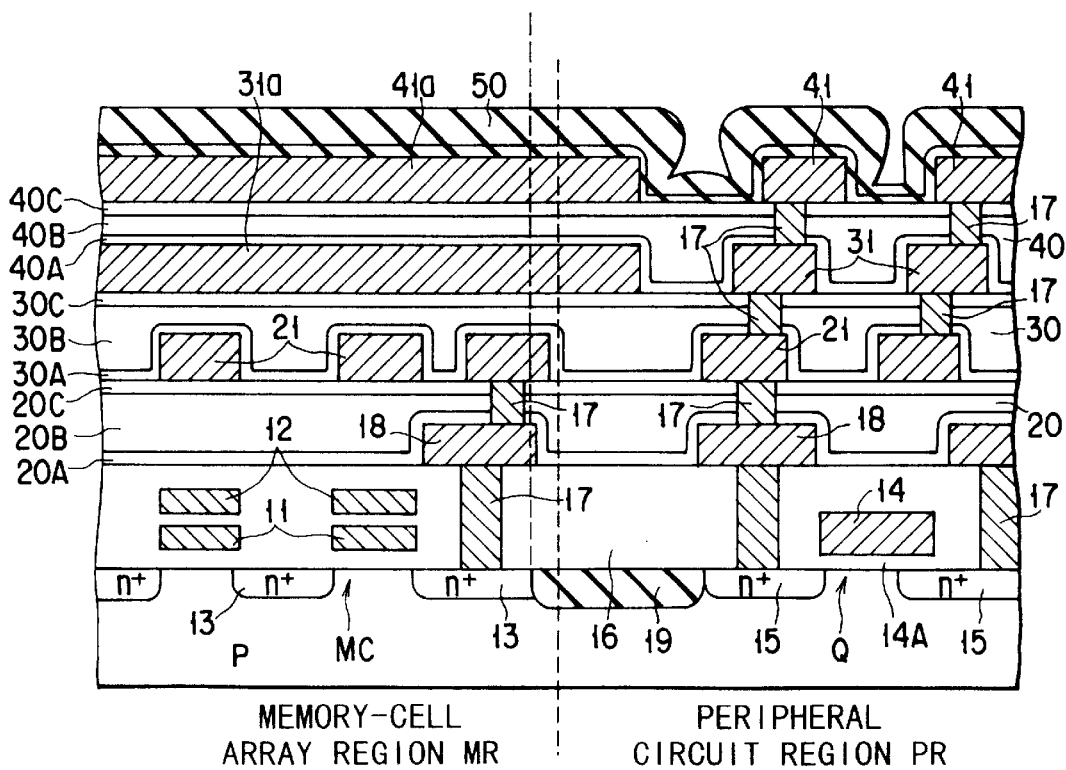
FIG. 6 is a sectional view of a semiconductor memory device having nonvolatile memory-cell array, which is a sixth embodiment of the present invention.

FIG. 6 depicts the sixth embodiment of this invention. As shown in FIG. 6, two layers of wires 18, 21 are provided in the memory-cell array region MR and four layers of wires 18, 21, 31 and 41 are provided in the peripheral circuit region PR. In the sixth embodiment, those parts of the metal films for the third- and fourth-layer wires 31 and 41, which lie in the memory-cell array region MR, are not patterned and left as plate electrodes 31a and 41a, respectively. Both plate electrodes 31a and 41a extend into the peripheral circuit region PR. It is desired that the upper plate electrode 41a more extend into the region PR than the lower plate electrode 31a, in order to prevent humidity and contaminant impurity from entering the memory cells MC.

Like the first to fourth embodiments, the fifth and sixth embodiments respectively shown in FIGS. 5 and 6 are advantageous in that the memory-cell array has sufficiently high reliability. To generalize the structures of the third to sixth embodiments, fewer layers of wires (m) are provided in the memory-cell array region MR that those (n) in the peripheral circuit region PR (n>m), and at least one plate electrode is provided above the uppermost layer of wires (m) in the memory-cell array region MR. As shown in FIGS. 3 to 6, the plate electrode (30a, 40a, 31a, or 31a and 41a) extends into the peripheral circuit region PR, preventing contamination of the memory-cell array more effectively than otherwise.

In the third to sixth embodiments, the plate electrode 30a, 40a or 31a, or plate electrodes 31a and 41a cover the memory-cell array. Once the plate electrode or plate electrodes have been formed. It is difficult to initialize the memory cells MC by applying ultraviolet rays. Therefore, ultraviolet rays are applied to the memory cells just before any plate electrode is formed in the manufacture of the third to sixth embodiments. As a result, changes in the threshold value of each memory cell MC can be minimized when the memory cell MC is charged thereafter.

A nonvolatile memory device according to the present invention may be an EEPROM (Electrically Erasable Programmable ROM) which has a reference memory cells used as a reference when the memory device is rewritten electrically. If so, it suffices to initialize only the reference memory-cell array region by applying ultraviolet rays to this region. Thus, it is sufficient to provide a plate electrode only in the body of the memory-cell array region used for storing data.

Figure 7:
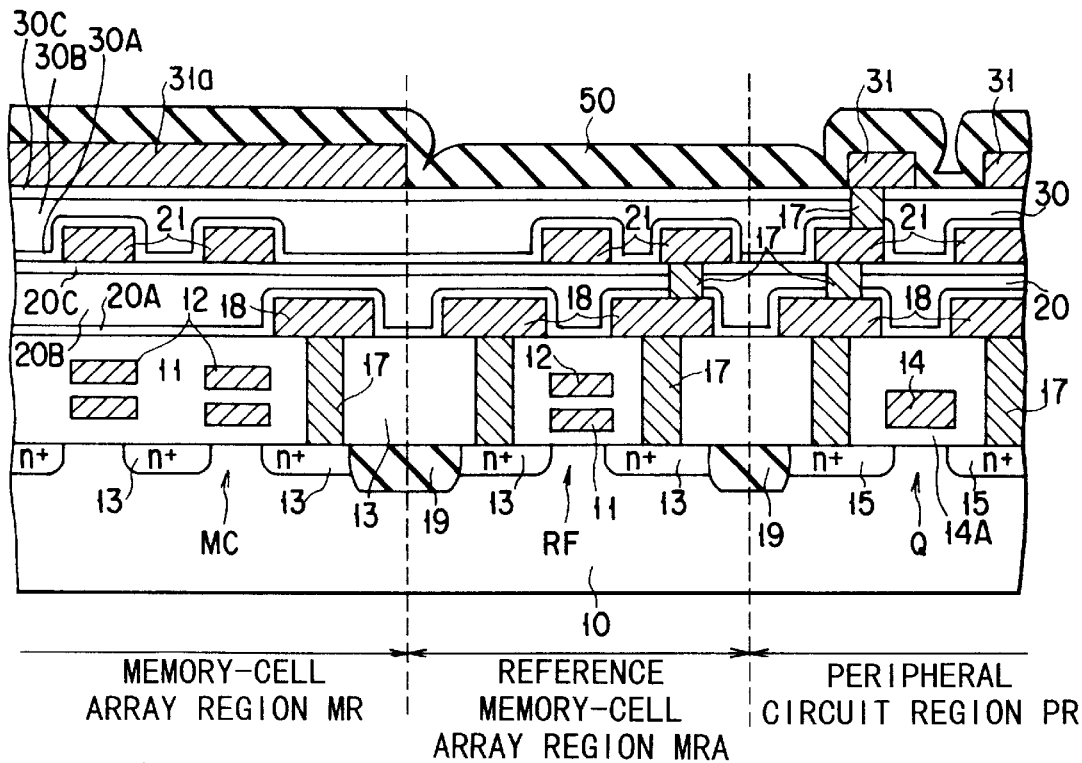
FIG. 7 is a sectional view of a semiconductor memory device having nonvolatile memory-cell array, which is a seventh embodiment of the invention.

FIG. 7 shows the seventh embodiment of the invention, which is an EEPROM. This embodiment is similar in structure to the third embodiment shown in FIG. 3. As shown in FIG. 7, a plate electrode 31a is provided in the memory-cell array region MR, and no plate electrode is provided in the peripheral circuit region PR or the reference memory-cell array region MRA having reference memory cells RF having the same structure as the memory cells MC. In the reference memory-cell region MRA, a passivation film 50 having a flat body is formed on the third interlayer insulating film 30 having the three-layer structure 30A–30C.

With this structure it is possible to initialize the reference memory-cell array by applying ultraviolet rays after the reference memory cells RF are formed. This structure can be applied to EEPROMs of the same basic structure as the fourth, fifth and sixth embodiments shown in FIGS. 4, 5 and 6.

Figure 8:
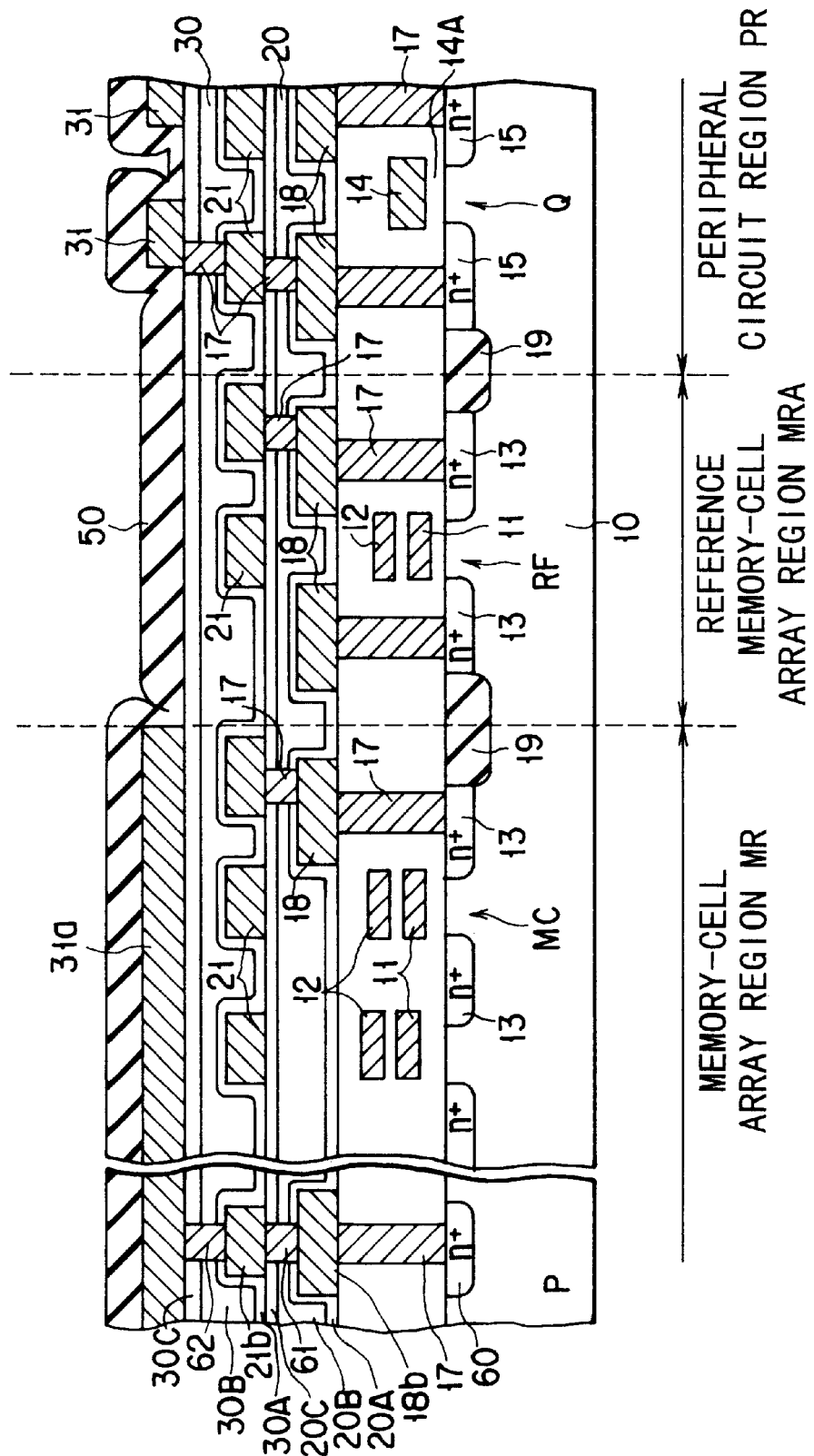
FIG. 8 is a sectional view of a semiconductor memory device having nonvolatile memory-cell array, which is an eighth embodiment of the invention.

FIG. 8 shows the eighth embodiment of this invention, which is similar to the seventh embodiment shown in FIG. 7. The eighth embodiment is different in that the plate electrode 31a provided in the memory-cell array region MR is connected to a $p^+$-type diffusion layer 60 functioning as a terminal and formed in the substrate 10 (or to a p-type well (not shown) provided in the memory-cell array region MR). More specifically, the plate electrode 31a is connected to the $p^+$-type diffusion layer 60 bia contacts 17, 61 and 62 and relay electrodes 18b and 21b. The contacts 17, 61 and 62 are buried in the via hole formed in the interlayer insulating films 16, 20 and 30, respectively. The relay electrode 18b has been formed simultaneously with the first-layer wires 18, and the relay electrode 21b has been formed simultaneously with the second-layer wires 21.

An insulating film that is great insulating property must surround the floating gate of each memory cell MC of a nonvolatile memory. The insulating film often receives a charging damage during the manufacture of the nonvolatile memory. The insulating film may be broken, or the memory cell may have its characteristic deteriorated. It is known that the charging damage occurs when any interlayer insulating film is electrically charged as it is exposed, while being formed, to high-density plasma, or when it is electrically charged as a photoresist is removed by means of ashing process.

In the eighth embodiment, the plate electrode 31a is connected to the terminal region 60 of the substrate 10 and thereby set at the reference potential like the substrate 10. Hence, the plate electrode 31a shields the memory-cell array region MR. The insulating film surrounding each memory cell MR is therefore protected from the charging damage that may occur in the manufacture of the nonvolatile memory after the formation of the memory cells MR.

The structure of the eighth embodiment can be applied to the wiring structures illustrated in FIGS. 3 to 6.

FIG. 9 is a sectional view showing the ninth embodiment of this invention. In the first to eighth embodiments, the memory-cell array region MR and the peripheral circuit region PR are adjacent to each other. By contrast, a memory-cell array drive region MDR is provided between the regions MR and PR in the ninth embodiment. Drive circuits are provided in the memory-cell array drive region MDR, for driving in the directions of rows and columns of memory cells. These drive circuits have the same number of wire layers as in the memory-cell array region MR, as in most nonvolatile memories. As shown in FIG. 9, the third interlayer insulating film 30, which covers the wires 21 of the uppermost layer, is made flat at its upper surface, by means of CMP method, for example. Thus, a passivation film 50 having good step coverage can be formed on the interlayer insulating film 30, covering not only the memory-cell array region MR but also the memory-cell array drive region MDR.

In the driving circuit region MDR, a driving transistor T having a drain region 15 and a gate electrode 14 is formed. The number of layers of wires in the regions MR and MDR is two, while three-layer structure is formed in the peripheral circuit region PR as in the case of FIG. 1 embodiment.

Figure 10:
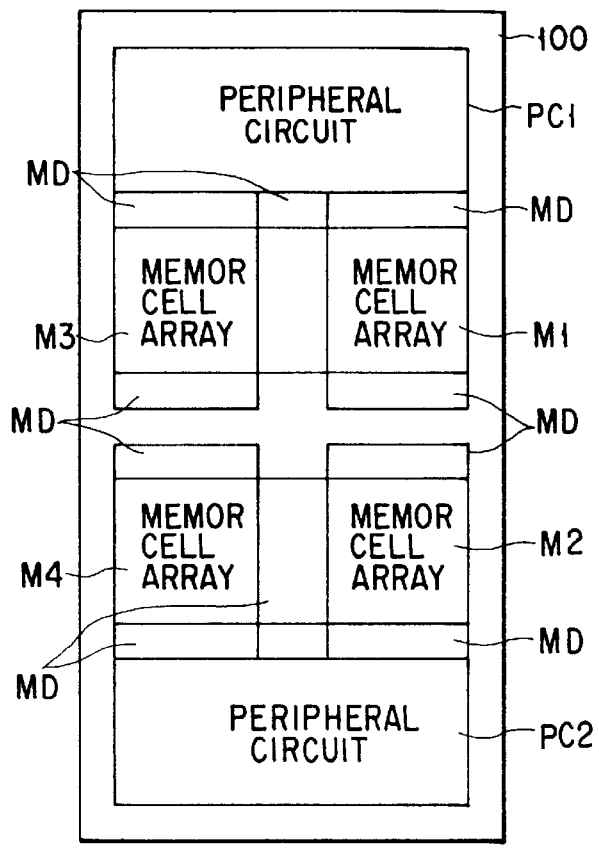
FIG. 10 is a plan view of a semiconductor memory device having nonvolatile memory-cell array, which is a tenth embodiment of this invention.
Figure 11:
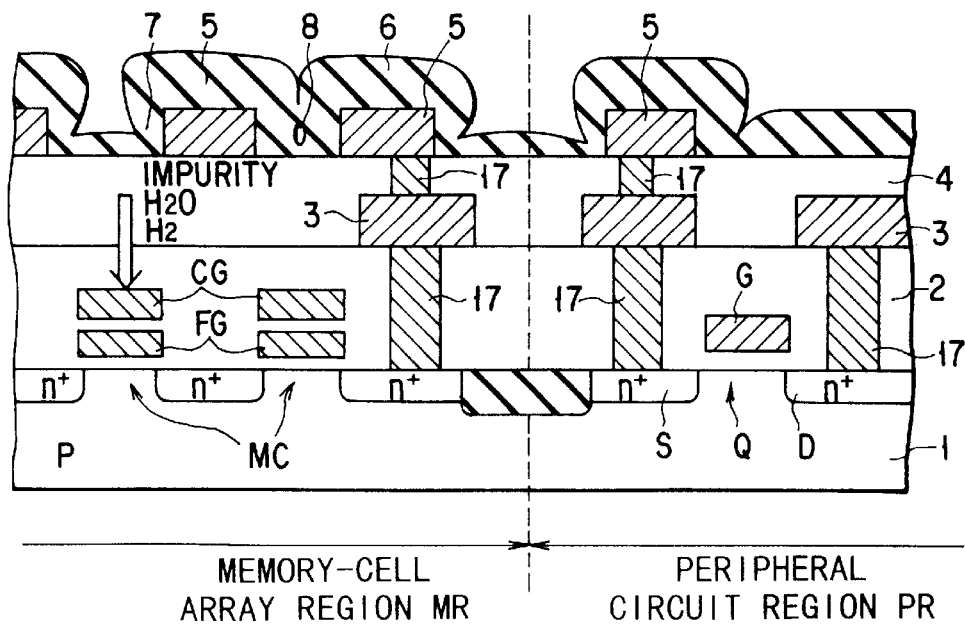
FIG. 11 is a sectional view of a conventional semiconductor memory device having nonvolatile memory-cell array.

FIG. 10 is a plan view of the tenth embodiment of this invention, which is a nonvolatile memory chip 100. The chip 100 has four memory-cell arrays M1 to M4, drive circuits MD, and two peripheral circuits PC1 and PC2. The drive circuits MD, such as row decoders and column decoders, are arranged around the memory-cell arrays M1 to M4. The peripheral circuits PC1 and PC2, each including logic circuits and an SRAM, are spaced apart, with the memory-cell arrays M1 to M4 and the drive circuits MD located between them. A passivation film (not shown) having a flat body covers not only the memory-cell arrays M1 to M4, but also the drive circuits MD. The nonvolatile memory chip 100 can therefore acquire high operating reliability.

As has been described, the present invention can provide a semiconductor memory device, in which fewer layers of wires are provided in the memory-cell array region than in the peripheral circuit region. No wires are formed on that part of the uppermost interlayer insulating film, which covers the memory-cell array region. This part of the interlayer insulating film has a flat upper surface. The passivation film deposited on this part of the uppermost interlayer insulating film has no defects at all, even if it is one having insufficient step coverage, such as a plasma nitride film is formed. This prevents a decrease in the operating reliability of the memory-cell array. In addition, the time required to initialize the memory cells by applying ultraviolet rays to them can be short because fewer layers of wires are provided above the memory-cell array region than above the peripheral circuits.

In the process of patterning a metal film to form wires of the uppermost layer of wires in the peripheral circuit region, that part of this metal film, which lies in the memory-cell array region, is left not patterned and is used as a plate electrode. The plate electrode, located below the passivation film, covers the memory-cell array, effectively preventing the humidity, hydrogen and contaminant impurity ions from entering the memory-cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate having a first region and a second region located adjacent to said first region;
    a memory-cell array including a plurality of nonvolatile memory cells provided in said first region;
    a peripheral circuit formed of circuit elements other than said nonvolatile memory cells provided in said second region;
    a first multi-layered wiring structure including m number of wiring layers, formed above said memory-cell array in said first region; and
    a second multi-layered wiring structure including n number of wiring layers, formed above said peripheral circuit in said second region;
    wherein said first and second multi-layered wiring structure are formed above an insulating film which includes at least one contact hole reaching at said semiconductor substrate, and n>m.

2. A semiconductor memory device according to claim 1, further comprising:
    a passivation film provided on an uppermost portion in said first region, wherein said passivation film has a part having a substantially flat body laying above said first region.

3. A semiconductor memory device according to claim 2, wherein wires included in said wiring layers are metal wires.

4. A semiconductor memory device according to claim 2, wherein the passivation film comprises a plurality of layers, wherein at least an uppermost of the layers is a silicon nitride film formed by plasma CVD.

5. A semiconductor memory device according to claim 2, wherein an interlayer insulating film formed in the first region beneath the passivation film includes an uppermost flat plasma oxide film having no via hole, provided by using $SiH_4$ as a feed gas.

6. A semiconductor memory device according to claim 5, wherein at least a part of said interlayer insulating film is sandwiched in two plasma oxide films each formed using $SiH_4$ as a feed gas.

7. A semiconductor memory device according to claim 2, further comprising:
    a memory-cell array drive circuit provided in the first region of the semiconductor substrate and arranged between the memory-cell array and the peripheral circuit.

8. A semiconductor memory device according to claim 1, further comprising:
    a metal-plate located in said first region, wherein said metal-plate is made of the same material as one of said wiring layers in said second region, wherein said metal-plate is located above an m-th wiring layer in said first region.

9. A semiconductor memory device according to claim 8, further comprising:
    at least one terminal provided in the first region of the semiconductor substrate and connected to the metal-plate.

10. A semiconductor memory device according to claim 8, wherein the memory-cell array has a first memory-cell region in which data is stored and a second memory-cell region in which reference cells are located and wherein the metal-plate is located above only the first memory-cell region.

11. A semiconductor memory device according to claim 1, further comprising:
    a metal-plate located in said first region, wherein said metal-plate is made of the same material as one of said wiring layers in said second region, wherein said metal-plate is located above an m-th wiring layer in said first region and is configured to completely cover upper portions of at least a plurality of said nonvolatile memory cells in said memory-cell array.

12. A semiconductor memory device according to claim 1, wherein wires included in said wiring layers are metal wires.

13. A semiconductor memory device according to claim 1, wherein said m is set to be at least one and said n is set to be at least two.

14. A semiconductor memory device according to claim 1, wherein said peripheral circuit includes a logic circuit.

15. A semiconductor device comprising:

a semiconductor substrate having a first region and a second region located adjacent to said first region;

a memory-cell array including a plurality of nonvolatile memory cells provided in said first region;

circuitry formed of circuit elements other that said nonvolatile memory cells provided in said second region;

a first multi-layered wiring structure including m number of wiring layers, formed above said memory-cell array in said first region; and a second multi-layered wiring structure including n number of wiring layers, formed above said circuit elements in said second region;

wherein said first and second multi-layered wiring structures are formed above an insulating film which includes at least one contact hole reaching at said semiconductor substrate, and n>m.

16. A semiconductor device according to claim 15, further comprising:

a passivation film provided on an uppermost portion in said first region, wherein said passivation film has a part having a substantially flat body laying above said first region.

17. A semiconductor device according to claim 15, further comprising:

a metal-plate located in said first region, wherein said metal-plate is made of the same material as one of said wiring layers in said second region, wherein said metal-plate is located above an m-th wiring layer in said first region.

18. A semiconductor device according to claim 17, wherein said metal-plate located in said first region is configured to completely cover upper portions of at least a plurality of said nonvolatile memory cells in said memory-cell array.

* * * * *

UNITED STATES PATENT AND TRADEMARK OFFICE
CERTIFICATE OF CORRECTION

PATENT NO.     : 6,501,127 B2
DATED          : December 31, 2002
INVENTOR(S)    : Seiichi Mori It is certified that error appears in the above-identified patent and that said Letters Patent is hereby corrected as shown below:

<u>Column 14,</u>
Lines 7 and 8, "structure" has been replaced with -- structures --,
Line 54, "located" has been replace with -- located, --.

<u>Column 15,</u>
Line 11, "that" has been replaced with -- than --.

Signed and Sealed this

Sixth Day of May, 2003

JAMES E. ROGAN
*Director of the United States Patent and Trademark Office*